United States Patent
Binnig et al.

[11] Patent Number: 5,835,477
[45] Date of Patent: Nov. 10, 1998

[54] MASS-STORAGE APPLICATIONS OF LOCAL PROBE ARRAYS

[75] Inventors: Gerd Karl Binnig, Wollerau; Heinrich Rohrer, Richterswil; Peter Vettiger, Langnau am Albis, all of Switzerland

[73] Assignee: International Business Machines Corporation, Armonk, N.Y.

[21] Appl. No.: 677,696

[22] Filed: Jul. 10, 1996

[51] Int. Cl.[6] ........................................... G11B 7/00
[52] U.S. Cl. ............................................. 369/126; 369/47
[58] Field of Search ........................... 369/126, 100, 369/47, 48, 49, 58, 59, 32, 84; 250/306, 307

[56] References Cited

U.S. PATENT DOCUMENTS

| | | | |
|---|---|---|---|
| 4,064,558 | 12/1977 | Hughes et al. | |
| 4,122,530 | 10/1978 | Smith et al. | |
| 5,036,490 | 7/1991 | Hiroshi et al. | |
| 5,216,631 | 6/1993 | Sliwa, Jr. | |
| 5,485,451 | 1/1996 | Yamano et al. | 369/126 |
| 5,490,132 | 2/1996 | Yagi et al. | 369/126 |
| 5,535,185 | 7/1996 | Kishi et al. | 369/126 |
| 5,572,502 | 11/1996 | Naruse et al. | 369/126 X |
| 5,623,295 | 4/1997 | Kishi et al. | 369/126 X |

FOREIGN PATENT DOCUMENTS

| | | |
|---|---|---|
| 0307210 | 3/1989 | European Pat. Off. |
| 0382062 | 8/1990 | European Pat. Off. |
| 0600511 | 6/1994 | European Pat. Off. |
| 3739161 | 6/1989 | Germany |

OTHER PUBLICATIONS

Patent Abstracts of Japan, vol. 015, No. 274 (p. 1226), 11 Jul. 1991 and JP A 03 093059 (Fuji Electric Co. Ltd) 18 Apr. 1991.
Patent Abstracts of Japan, vol. 015, No. 295 (E–1094) 16 Jul. 1991 and JP A 03 104421 (Hitachi Ltd; Others: 02) 1 May 1991.
IBM Technical Disclosure Bulletin, vol. 37, No. 10, Oct. 1994, pp. 223–226.
Modeling and Simulation, vol. 14, Proceedings of the Fourteenth Annual Pittsburgh, PA. 21–22 Apr. 1983, Research Tri. Park., NC, pp. 241–245.
IJCNN '93–Nagoya, Proceedings of 1993 International Joint Conference on Neural Networks (Cat. No. 93CH3353–0) Proceedings of 1993 International Conference on Neural Networks (IJCNN–93–Nagoya, Japan) Nagoya, D Japan 25–29 Oct. 1993, IEEE, pp. 2967–2970, vol. 3.

*Primary Examiner*—Muhammad N. Edun
*Attorney, Agent, or Firm*—Stephen S. Strunck

[57] ABSTRACT

The present invention concerns a storage device comprising a local probe array (72) and a storage medium (70) with an array of storage fields (71). The local probe array (72) is situated opposite to the storage medium (70) such that each local probes (73) of the local probe array can be scanned over the corresponding storage field (71). The storage device further comprises circuit for distinguishing between information to be erased from a first section of the storage medium and information in this section which is not to be erased, circuit for selectively copying the information which is not to be erased into a memory, preferably another section of said medium, and circuit for erasing the whole first section.

30 Claims, 5 Drawing Sheets

MASS-STORAGE APPLICATIONS OF LOCAL PROBE ARRAYS

TECHNICAL FIELD

The present invention relates to storage devices based on local probe arrays and appropriate storage media.

BACKGROUND OF THE INVENTION

Improvements in semiconductor processing techniques have led to drastic reductions in the size of todays computers. However, while the microprocessors, displays and other components are getting cheaper and smaller, the bulk data memory units limit the overall size reduction. For further reduction in size and power consumption the conventional disk drive storage systems need to be replaced by small, high capacity storage devices. Such disk drive storages which usually have a rotating memory store as much as one Gigabyte of data, but offer modest read/write speed on the order of milliseconds only. Solid state memories, on the other hand, offer much higher read/write speeds on the order of nanoseconds. However, their storage capacity is limited to a few Megabit. In terms of cost per bit, rotating memory is cheaper, but it is also much more mechanically unreliable because of the moving parts.

There is a clear demand for single storage devices having storage capacity of more than 1 Terabit. It is further important for such a storage device, in particular when being used in a multimedia system where image frames need to be retrieved in a fast and consecutive manner, that very high data rates (read/write speed) can be achieved. Other important aspects are power consumption, overall weight and size, reliability, data security, and shock resistance (if used in portable computer systems). With a storage device which combines the capacity of a rotating memory with the speed, size, power consumption and reliability of solid state memories, computers would take another quantum leap in performance and compactness.

The development of scanning tunneling and atomic force microscopes has led to first storage systems which make use of parallel local probes.

A scanning tunneling storage system has been proposed in the European patent EP 247219. This system comprises current detectors being attached to an array of cantilevers. A storage medium is placed opposite to the array. The storage medium is displaced by means of a two-dimensional piezo-electric positioning device. There is no adequate approach for erasing of information disclosed.

In U.S. Pat. No. 5,307,311 a memory device is described which makes use of a very large set of independently operating subdevices. It employs an array of hundreds of microcantilevers having an area in which bits are stored. Opposite to these cantilevers there are hundreds of read/write heads which are similar in nature to scanning tunneling or atomic force microscope scanning tips. Each cantilever is moved in an oscillatory manner such that the respective read/write head scans over the bits stored thereon.

It is a clear disadvantage of such scanning probe storage systems that they are very complex. Each such substorage needs its own driving mechanism and electric wiring as well as write and read lines connected to the numerous read/write heads.

It is essential for a storage device that information can be erased. In particular in case of scanning probe storage systems which have been proposed so far no reliable and satisfying erase technique has been proposed. Recent material investigations have revealed special materials which are in principle suitable as erasable storage medium. However, steps required to erase information being stored in such a material are either to slow, or cannot be controlled properly to facilitate erasure of single bits within a storage medium.

In view of the disadvantages of known media suitable for use in scanning probe storage systems there is a need for improved materials and storage concepts in particular to overcome the problems inherent to the erase process. The high resolution available through the application of a STM or AFM is certainly a most desirable attribute. However, for purposes of mass data storage, the erase capabilities of known approaches are much too slow for any practical application.

It is an object of the present invention to provide a method and apparatus which improves known scanning probe storage systems.

It is a further object of the present invention to provide a method and apparatus which allows fast and reliable erasure of stored information.

SUMMARY OF THE INVENTION

This has been achieved by the provision of a storage device having

- a storage medium (10) on which information can be stored in form of perturbations (12),
- a local probe array (20) facing said medium (10) such that its probes (14) scan said medium (10),
- means for obtaining signals from each of said probes (READ) when scanning over said perturbations, and
- means for writing perturbations onto said medium (WRITE).

Said storage device is characterized in that it further comprises

- means for distinguishing between information to be erased from a first section of said medium and information in this section which is not to be erased,
- means for selectively copying said information which is not to be erased into a memory, preferably another section of said medium, and
- means for erasing the whole first section (ERASE).

DESCRIPTION OF THE DRAWINGS

The invention is described in detail below with reference to the following schematic drawings.

GENERAL DESCRIPTION

Figure 1A:
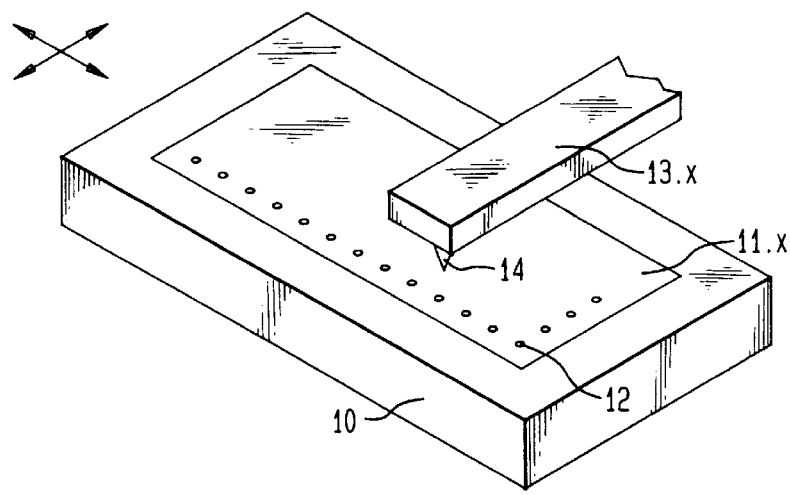
FIG. 1A shows a perspective view of part of a storage device, in accordance with the present invention.

Before different embodiments of the present invention are described, the basic elements of the storage devices in accordance with the present invention are addressed.

Cantilevers and cantilever arrays:

Cantilevers are well known elements which are easy to make. Existing semiconductor fabrication processes can be employed. In essence, the techniques of micromachining are employed to create discrete cantilevers and arrays of cantilevers. When dimensioning such cantilevers, one has to take into account specific parameters of the material used as substrate in which the cantilevers are formed. When properly designing such an array, it can be mass-produced at low cost and with high yield.

Usually, cantilevers and cantilever arrays are made by etching away portions of a silicon substrate. This substrate is normally (100) or (111) oriented. (100) oriented silicon could for example be wet etched using ethyl diamine pyrocatechol or KOH solutions. Wet etching techniques are generally dependent on crystallographic orientation of the substrate, e.g. (100) oriented silicon shows a very low etch rate of the (111) plane, leading to a good etch stop along the (111) axis which generates well defined etch planes with 54.7° angles from (100). An alternative approach makes use of dry etching techniques, e.g. reactive-ion beam etching (RIE), chemically assisted ion beam etching, or microwave assisted plasma etching. Depending on process conditions, deep and anisotropic structures can be obtained leading to excellent dimensional control. Masks can be employed to define the structures to be etched. The cantilevers used can have any shape that can be obtained by photolithography and etching. The cross-sectional shape could for example be rectangular, round, elliptical, or polygonal.

Also suited for the fabrication of cantilevers are other semiconducting materials, like gallium arsenide, as reported in "dynamic Micromechnics on Silicon: Techniques and Devices", K. E. Petersen, IEEE Transactions on Electronic Devices, Vol. ED25, No. 10, 1978, pp. 1241–1249.

Local probes and local probe arrays:

Usually a tip is used as local probe. Different techniques are known to produce such tips. They can for example be made by isotropic wet or dry etching in combination with the oxidation of a single crystal material such as silicon. The following materials are well suited for making local probes and local probe arrays: tungsten, tungsten alloy, platinum, molybdenum, silicon (doped or undoped), doped diamond, any refractory metal, or conductive ceramics, to name some. The combination of wet or dry etching and liftoff plus oxidation leads to very sharp pointed cones. The sharper the tips are, the denser information on a storage medium can be stored, i.e. the higher the storage capacity of a storage device will be. The probes can be coated with an appropriate metal such as gold, for example. In U.S. Pat. No. 5,204,581 it is described in detail how to make tips or arrays of tips which can be used in connection with the present invention. Another example for the microfabrication of a tip is disclosed in the article "Silicon cantilevers and tips for scanning force microscopy", J. Brugger et al., Sensors and Actuators A, Vol. 34, 1992, pp. 193–200. It is important to note that by means of batch fabrication local probe arrays can be made in a reproducible and cheap manner.

Driving circuitry:

Certain means, including driving circuitry, preamplifiers, and an appropriate wiring for reading and writing information need to be provided. To make these means one can employ existing tools and processes common to the semiconductor and solid-state industries. The driving electronics as well as the probes call for circuitry like that used in scanning tunneling microscopy (STM) and atomic force microscopy (AFM) systems, albeit shrunken to extremely small size. The miniaturization is mandatory to obtain short interconnections, high speeds, and less power for circuitry. To cope with the high data rates which can be achieved by a highly parallel scanning probe array, one needs to provide very fast electronic circuitry for reading and writing information.

Storage media:

A storage medium in accordance with the present invention is partitioned into storage fields in which the information is actually stored. The media which can be used in connection with the present invention can be grouped as follows. In general, perturbations can be formed in a medium, or removed therefrom by locally creating or altering the topographic features or composition;

altering the crystalline phase;

creating or destructing electronic states;

filling or emptying existing electronic states;

creating or altering domain structures or polarization states;

creating or altering chemical bonds.

In addition to the above examples, any combination of physical or chemical effects can be used. A good and detailed description of the different media suited is given in U.S. Pat. No. 5,307,311.

Another approach, not explicitly mentioned in the above US patent, would be to use a very soft, wax-like material, polymer, or liquid crystal in which perturbations are created either by locally heating the material, or by imprinting patterns or pits by moving the probe up and down. By heating up the material so as to melt it locally, or over a larger area, e.g. one storage field, one could clean it up (erase). The heating could be achieved electrically, e.g. by local heating element such as resistors, or by means of a laser beam. It is for example possible to provide each local probe array with a heat source, e.g. a resistor, such that the warm probe generates perturbations in the storage medium. By means of heating elements integrated into said storage medium, or placed on the backside thereof, whole storage sections can be erased at once.

Perturbations can also be generated by employing the tunneling effect in order to move and remove atoms. This approach, according to which the information is stored in the form of patterns of atoms adsorbed on the surface of a storage medium, is described in U.S. Pat. No. 4,575,822. The probe is maintained at tunneling distance from the medium to remove individual atoms from the medium for writing, and to detect variations of the tunneling current caused by the presence or absence of atoms in scanned locations for reading.

Well suited are nitride-oxide-silicon media, as shown in connection with the first embodiment of the present invention. Either a scanning tunneling tip, or a scanning capacitance probe placed at a certain distance with respect to the nitride-oxide-silicon medium can be used to measure and to detect perturbations. Further details are given in the article "Charge storage in a nitride-oxide-silicon medium by scanning capacitance microscopy", R. C. Barrett et al., Journal of Applied Physics, Vol. 70, No. 5, 1 Sep. 1991, pp. 2725–2733.

In addition to permanent storage media, temporary storage media are known. One example is a medium in which electric charges are trapped when writing information into it. After a while this information disappears because the electron charges get spread out. A material which shows such a behavior could also be used in connection with the present invention, as will be described later.

Beneath STM based approaches, AFM techniques which are capable of seeing contrasts (perturbations) on insulating and magnetic storage media without using any electrical currents, or any combinations of AFM and STM can be used.

The different storage media can be structured so as to provide separate storage fields thereon. These fields are arranged such that they do not overlap. Usually there is a certain distance left between neighboring fields to ensure that the data of the respective fields are clearly distinguishable. The more densely these storage fields can be arranged, the higher the storage density of the overall storage device are.

Scan movement:

In the present invention different approaches for achieving a scan movement of the probes with respect to the storage medium are made use of. The simplest approach is to move either the whole local probe array while the storage medium's position remains unchanged, or the other way around. An additional degree of freedom can be achieved if the storage medium and the local probe array are moved. It is, for example, advantageous to slowly move the storage medium back and forth in a direction parallel to a first axis. The scan excursion of the storage medium is chosen such that the local probes do not exceed the corresponding storage fields, i.e. the scan excursion is approximately equal to the dimension of the storage fields. At the same time the local probe array is step-wise moved perpendicular. Due to the combined movement of the local probe array and the storage medium, a first row of the storage fields is scanned. Then, the probes jump to the next row before the storage medium moves back. This next row is now scanned in the opposite direction, and so forth. This approach is known as 'basket-weave scanning' in the area of scanning electron microscopy.

One can use a variety of scanning schemes including pulsed and continuous scanning as well as varying speeds.

Tracking:

In a storage system where the local probes do not have their own actuators, tracking can be achieved by providing special tracks at the edges of the storage medium which are watched and followed by the moving local probe array. Tracking can for example be achieved by mechanical means which guide the local probe array along a predefined direction. Such mechanical tracking means can be combined with, or completely replaced by, optical or other contactless tracking means. Deflection sensors on the local probe array, which are arranged such that they interact with counterparts on the storage medium, allow to precisely move the array parallel to the storage medium. Special tracking marks can be used to mark the boundaries of the storage fields and/or storage medium. If such a tracking mark is reached the local probe array can be triggered to move backwards, or to jump to another position, for example.

Tracking is also important to ensure that the storage device will return into a well defined position after power-off or after it has been parked.

In addition to the actuators employed to move the whole local probe array and/or the storage medium, each local probe or the cantilever on which it is situated might have its own actuator. Each such actuator needs appropriate wiring and driving circuitry. Two different schemes are conceivable if one employs such semi-autonomous local probes: 1) the local probe actuators can be used to compensate fabrication tolerances and to level out local surface roughness of the storage medium; 2) The local probes themselves might contribute to the scan movement in which case more complex local actuators are required. If such local probe actuators are employed, one might also envision to provide tracking on a storage field basis. One example would be to arrange a long chain of atoms along a row such that these atoms can be detected and followed by the local probe.

Actuators:

Each of the cantilevers might comprise an actuator so as to displace it from a relaxed position to a deflected position or vice versa. The displacement achieved by an actuator might be damped to prevent damage, for example.

The different cantilever movements which can be achieved with an integrated piezoelectric actuator, also referred to as transducer, are depicted in FIGS. 34–37 of the published PCT patent application WO 89/07256. The variety of movements which can be achieved facilitates local probe storage devices where each of the cantilevers out of an array of cantilevers has additional freedom of action. It is conceivable that the array as a whole is scanned over the storage medium in a slow, closed loop manner and that each cantilever scans a smaller subarea which is currently in reach.

Coarse Actuators:

In addition to the actuator of each cantilever, a coarse macroscopic distance adjustment might be required, depending of the particular application. A coarse actuator might be employed to move the probes of an array within reach of the storage medium and the fine actuator means of the cantilevers then provide the operating gap control. Coarse displacement can be used to compensate manufacturing tolerances, to move the array in a park position when not being used, or while a certain area is erased in accordance with the present invention. For coarse displacement PZT (a piezoelectric ceramic material; Lead Zirconate Titanate) actuators or precision levers and micrometer screws can be used.

The above mentioned actuators need specific driving circuitry which can either be integrated into the present storage device, or which can be carried out separately. It is important that the scan movement is synchronized with the multiplexers/demultiplexers used for reading and writing of data.

Interface electronics:

In addition to the driving means and read/write electronics kind of an interface circuitry is needed. Such a circuitry might include a microprocessor, multiplexer/demultiplexer, parallel-to-serial converters and serial-to-parallel converters, digital/analog and analog/digital conversion circuits and so forth. Of particular importance are error correction means. For some applications it is advisable to employ a microprocessor which coordinates all activities of the storage device. It is likewise conceivable to design the present storage device such that it cooperates with the microprocessor of a computer of which the storage device is a part. Very fast electronic or optical switches might be employed to cope with the huge amount of data accessible through hundreds or thousands of local probes of the present storage devices.

Before a complete storage device in accordance with the present inventions is described, the basic building blocks thereof are now defined with reference to FIG. 1A.

Figure 1B:
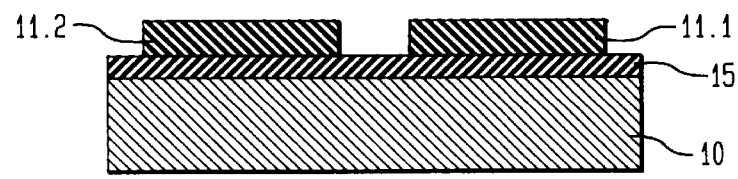
FIG. 1B shows a cross-section of the storage device of FIG. 1A.
Figure 2:
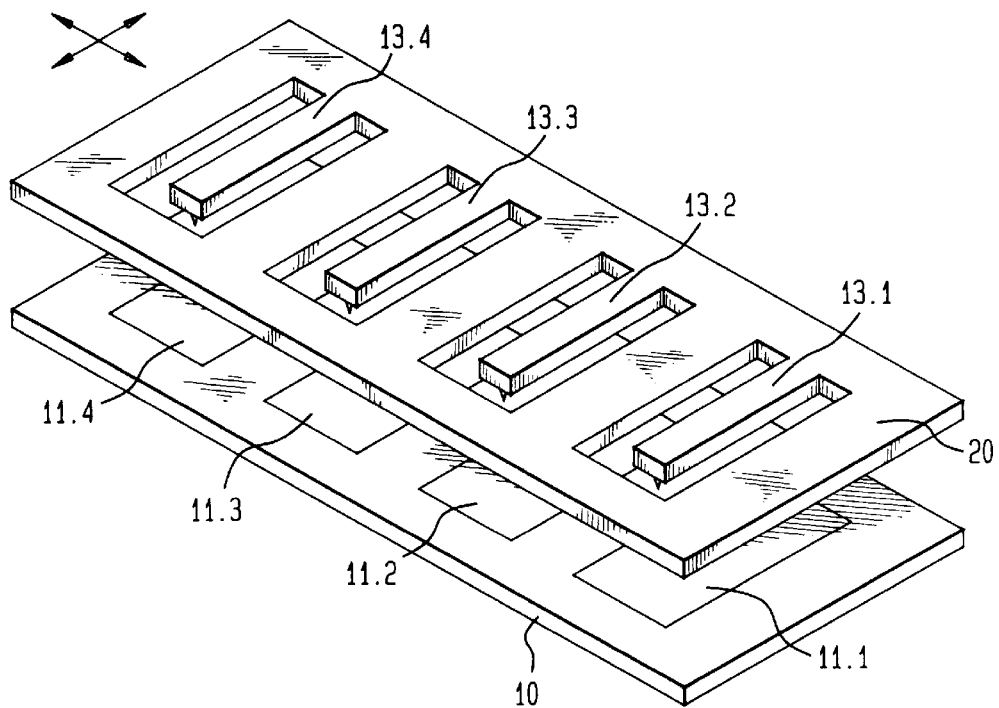
FIG. 2 shows a perspective view of the storage device, part of which are illustrated in FIGS. 1A and 1B, in accordance with the present invention.

Referring to FIGS. 1A, 1B and 2, a first embodiment of the present invention will now be described. A storage field 11.1, as shown in FIG. 1A, comprises small perturbations in the storage medium 10. Each of these perturbations represents a bit. Such perturbations can be very small. Perturbations having a size of a few nm were reported in the art. To ensure that such perturbations can be easily detected, the centers of neighboring perturbations should be about 30 nm apart. A storage field in accordance with the present invention might have a size of 30 $\mu$m×30 $\mu$m leading to a storage density per storage field of $10^6$ bits. In FIG. 2, a sub-array of four storage fields 11.1–11.4 is shown. $4\times10^6$ bits can be stored in such a sub-array. Depending on the storage medium and the process used for the detection of perturbations, a bit scan speed (read-out speed) of about 100 kHz per tip can be achieved. In accordance with the present invention, a local probe array with four cantilevers 13.1–13.4 with the respective tips is scanned as a whole over the corresponding storage fields 11.1–11.4 and the data in each storage field are addressed quasi-simultaneously. In addition to this lateral movement a displacement of the array in the direction perpendicular to the medium might be useful, e.g. when parking the array. The maximum lateral scan excursion of a tip depends on the dimension of a single storage field. In the present example, the maximum scan excursion is $\geq 30$ $\mu$m. Using known x-y positioning means, an access time in the range of 1 ms to 1 $\mu$s can be achieved. This compares very favorably with present day disc drive access times of about 10 ms. In case of a storage system as illustrated in FIG. 2, a total data rate of $4\times10^5$ bits/s can be obtained (assuming $10^6$ bits/storage field, 4 fields and 100 kHz scan speed), of course, these numbers scale with the the scan speed and the number of storage fields.

Further details of the first embodiment and the materials used are given now. The local probe array 20 comprises metallized cantilevers 13.1–13.4 and tips. The storage medium consists of a semiconducting substrate 10 covered by a thin oxide layer 15. This oxide layer 15 is coated with patterned dielectric layers 11.x. The size and shape of these dielectric layers 11.x define the storage fields. The cantilevers 13.x are designed such that the tips are pressed against the storage fields. When scanning the whole array 20 over the storage medium 10, the tips are used to measure the electrical properties of the corresponding storage fields.

The local probe array of a storage device in accordance with the first embodiment can be simply addressed by four X-Y access lines, respectively, which enable read/write of the local probe in a chosen storage field at a bit position within this storage field given by the momentaneous position of the local probe array. In case of a storage devices with N×N storage fields, $N^2$ X-Y access lines would be needed.

Well suited as storage medium is a combination of silicon as substrate 10 with nitride as dielectric layers 11.x. In such a material, information can be stored in form of charges which are trapped in the nitride layer. Charges are introduced, i.e. written, by applying a bias to the respective tip. This causes charges to tunnel through the oxide layer 15 and to become trapped in the nitride layer 11.x. These perturbations in form of charges have been observed to be stable over a period of several days. The perturbations can be detected, i.e. read, either by using the tips of the local probes, or by obtaining a capacitance image of the storage fields using the metallized cantilever. The perturbations can be largely removed, i.e. erased, by applying a reverse bias between the tip and the storage medium. The charge trapping mechanism is not completely reversible such that always some residuals of the charges are left over. In particular if one tries to erase perturbations by applying a short reverse biased pulse to the tip, the perturbations are not removed completely. The longer such a storage medium is used, the worse the signal-to-noise ratio becomes when reading the information stored. If the information would be erased the conventional way, i.e. on a bit-by-bit basis, the whole sub-array in FIG. 2 would either be totally blocked, or the read/write process in neighboring fields would be delayed due to the slow erase process. According to the present invention, this problem has been overcome by completely cleaning-up whole storage fields from time to time. For this purpose either the tips can be reverse biased and moved slowly over the storage fields, or additional means can be provided to remove these charges. Neighboring storage fields could for example be cleaned-up separately, if there are separate contacts to the storage medium's backside and if neighboring storage fields are sufficiently isolated from each other. This allows to apply a revered bias to one storage field while writing information into an adjacent field.

To achieve this, a data management scheme and appropriate means for its implementation are provided. Because there neither exists a reliable and fast erase mechanism for bit-by-bit erasure, nor there is any in sight, a different approach is proposed. According to the present invention new information, or information to be changed, is written into specially selected blank storage fields or areas of such storage fields.

Figure 3:
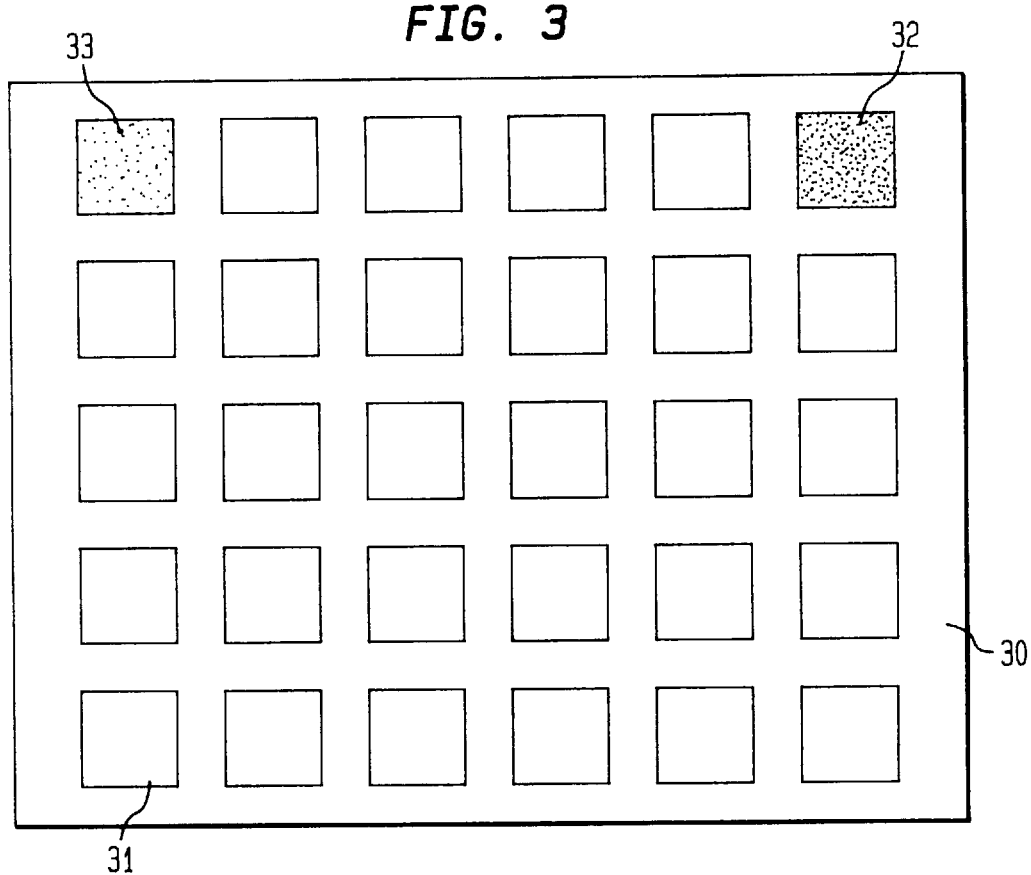
FIG. 3 is a top view of a storage medium structured in accordance with the present invention.

An example is illustrated in FIG. 3. In this Figure, a top view of a storage medium 30 with several storage fields 31 is depicted. Before the storage field 31 is erased, all information in this field which is still needed is transferred to another, empty field 32. Likewise, a conventional memory device might be employed for storing such information which is still needed.

Figure 4:
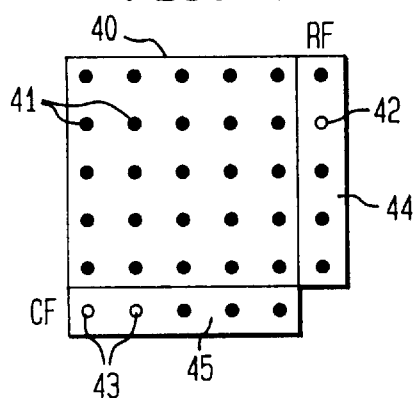
FIG. 4 is a top view of a storage field, in accordance with the present invention.

The present storage device comprises means which help to distinguish information which is not longer needed from information which is still needed. This can be done by means of a table maintained in a reserved, separate storage field 33, or by reserved bits, e.g. at the side of each storage field. Two different approaches are outlined in connection with FIGS. 4 and 5B. In both Figures, a storage field 40 is shown which comprises 25 bit locations, for example. Assuming that two of these bits, see reference numeral 41, are still needed, whereas all other bits are not longer needed, these two bits have to be marked appropriately. In FIG. 4, there is a column of flags, referred to as row flags (RF) 44, and a row of flags, referred to as column flags (CF) 45. The first and second bits 43 of the CFs 45 are raised (e.g. 'one') and the second flag 42 of the RFs 44 is raised, too. These three flags 42 and 43 clearly identify the bits 41 as still being used.

Figure 5A:
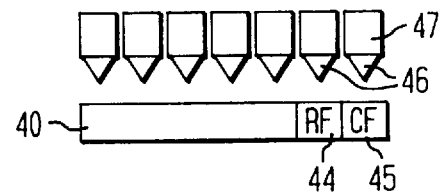
FIG. 5A shows a cross-section of part of a storage device, in accordance with the present invention.
Figure 5B:
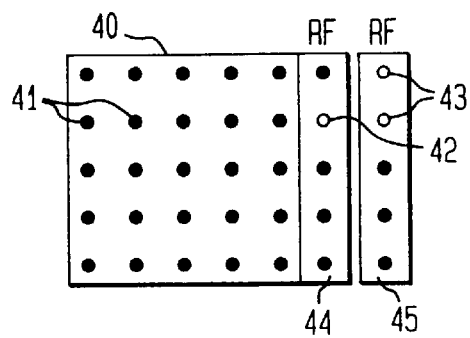
FIG. 5B is a top view of the storage device of FIG. 5A, in accordance with the present invention.

In FIG. 5B, the CFs 45 are rotated and placed next to the RFs 44. As in FIG. 4, the flags of the CFs 45 point to the respective rows and the flags of the RFs 44 point to the respective columns of the storage field 40. The advantage of this arrangement is that the flags can be read concurrently with the bits in the storage field, provided that there is an array of parallel levers 47 probes 46, as depicted in the cross-sectional view given in FIG. 5A. An alternative approach would be to mount all these parallel probes 46 at the end of one and the same cantilever. In this case additional means have to be provided which give each probe some freedom of movement along the z-axis in order to level out surface roughness of the storage medium. If one assumes a 30 nm bit size, there would not be sufficient space to realize the tips 46, because the distance from tip to tip would also be 30 nm. To overcome this problem, the data on the storage medium can be arranged in an interleaved manner. If one assumes a distance between neighboring tips of 300 nm the 1st, 11th, 21st, 31st and so forth columns would be read concurrently. Then, the probe array 46 is moved 30 nm and the 2nd, 12th, 22nd, 32nd etc. are read.

Instead of using a separate table or column and row flags, each bit word in the storage field could comprise a header indicating whether the information comprised in the word is still needed.

Figure 6:
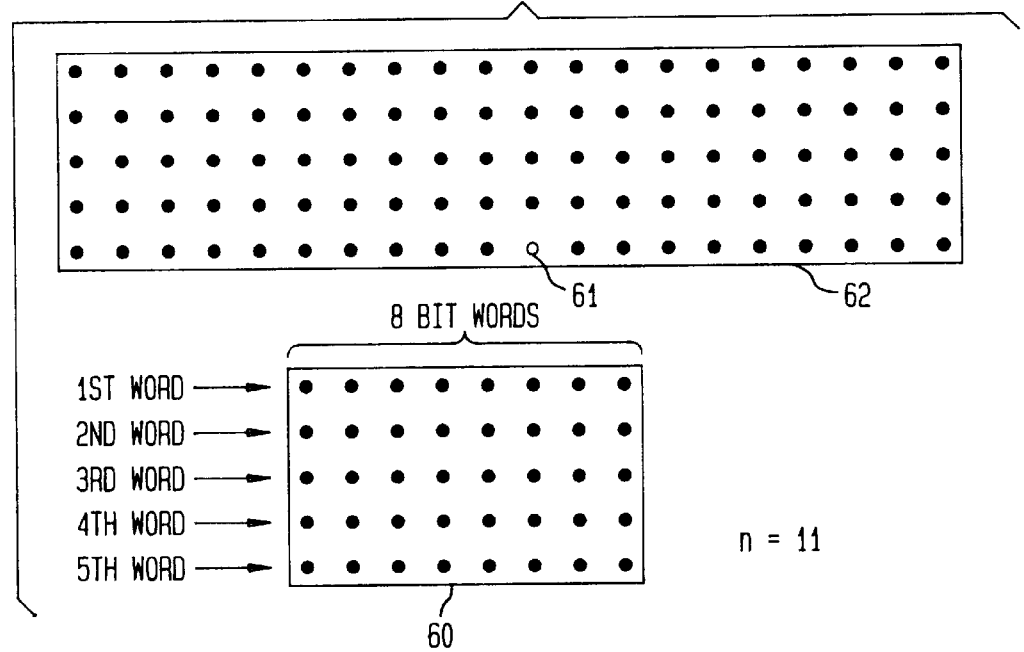
FIG. 6 shows a top view of a storage field and a table maintained in another field, in accordance with the present invention.

The means used to indicate what part of the information in a storage field is still needed is hereinafter referred to as erase pointers and the process used to distinguish between information which might be used later and information not longer used is called erase data management. In case that one uses a column and row flag for each bit, much real estate on the storage medium is wasted for these erase pointers. Depending on how the information in a storage field is organized, less erase pointers are needed. In FIG. 6 an example of five 8-bit words within a storage field is illustrated. The whole sub-array, not shown in this Figure, e.g. comprises 20 storage fields (n=20) each having the capacity for storing five 8-bit words, i.e. the overall storage device has a capacity of 800 bits. In the present example the 11th storage field 60 (n=11) is to be erased because most of the information is obsolete. Only the fifth word in this field 60 is still needed. In a corresponding erase pointer table 62, a flag 61 is raised which indicates that the fifth word in the 11th storage field 60 (n=11) should not be erased. The fifth word is consequentially rescued by copying into another field before the whole storage field 60 is then cleaned-up.

It is obvious from this and the previous examples that there are many different approaches conceivable to determine whether information can be erased. The longer the bit words in the storage fields are, the less pointers in the erase pointer table or the less erase flags are required.

The essential steps of the erase data management process are now described:

First of all, the erase pointers are checked to detect whether a particular information is still needed or not, i.e. either the corresponding flags, headers, or a table maintained separately are consulted. In case of the examples illustrated in FIGS. 4 and 5, a simple AND combination of the respective row and column flags could be generated. The result of this AND combination is then mapped onto the information in the storage field to distinguish information no longer needed from the information which is still needed.

The information identified as still being needed is then transferred from the respective storage field into another, blank storage field (field 32 in FIG. 3, for example). Once all information in the originating storage field has been 'rescued', the next step is initiated.

The whole originating storage field, or several such fields are now erased at once. Depending on the material used as storage medium, this can be done by illumination, heating, demagnetizing, or discharging, as explained above. While one or several storage fields are erased, it is advantageous to park the cantilever array, or to move it in a manner that the whole surface of the storage field can be accessed without interfering with the cantilever.

A coarse actuator could for e)(ample be employed to remove the cantilever array, or likewise a shape memory alloy (SMA) can be used to displace or flip the array.

A storage field which has been erased can now b:e marked and treated as a blank storage field.

While the information not pointed at by an erase pointer is transferred into another, blank field, an error detection mechanism might be applied to check whether information got corrupted. Any kind of error detection mechanism, like cyclic-redundancy check, can be employed.

In addition to the pointing at information which is to be deleted, one can use a similar approach to access information which needs to be changed. Using such a 'change pointer', one can retrieve a word from a storage field. This word is then forwarded to a processor where it is processed and changed. The changed word is then stored in another, blank field and the position in the storage field where it was stored beforehand is marked by means of a erase pointer, because this information is not longer needed. If the result of the calculation showed that the word does not need to be changed, no erase flag needs to be raised and there is no need to write this word into another storage field.

Since overwriting of information is not possible in the conventional sense, the storage fields of a storage device might get filled up under certain circumstances. Despite of the tremendous storage capacity this calls for a compression of the data. In accordance with the present invention a process for geometrical compression of the data, which goes hand in hand with the above described erase process, is described. In the following, two different compression schemes are addressed.

In-out clean up:

As described in connection with the above erase process, a storage field is searched for information not longer needed using the respective erase pointers. The information which is still needed is then transferred into another, blank storage field. According to the present invention this transfer of information is done geometrically, i.e. blank areas in originating storage field are copied and appear as blank areas in the destination storage field on a bit-by-bit basis. Now, a compression mechanism (fuzzy puzzle clean-up) starts searching for files or words from other storage fields or sub-arrays that fit well into the blank gaps in the destination field. Due to the fact that there are hundreds or even thousands of different storage fields, the probability to find such words or files is very high. Like in a puzzle, a destination field is now packed until its storage capacity is almost, or in some cases even totally used up. Kind of a 'traveling salesman' approach, making use of a 'travelling salesman algorithm', or a genetic algorithm might be used such that the storage density is optimized in an evolutionary manner. Such a 'travelling salesman algorithm' or genetic algorithm allow fast and efficient copying of information from one storage field directly into another. If such a smart algorithm is not implemented, it is advantageous to copy the information still needed into a temporary storage field or external storage device. The information can then be compressed and afterwards stored in a blank storage field, for example.

The data compression can be further improved or modified, for example, by applying certain rules for the selection of a storage field which is to be emptied. This field could be selected by comparing the amount of obsolete data of a field with the amount in other fields. The storage field with most obsolete data, i.e. the field where only a few bits are still needed, can be treated first. Then the next storage field follows, and so on. The rules for cleaning-up certain storage fields can either be user-defined, or can be implemented when designing a storage device.

Figure 9:
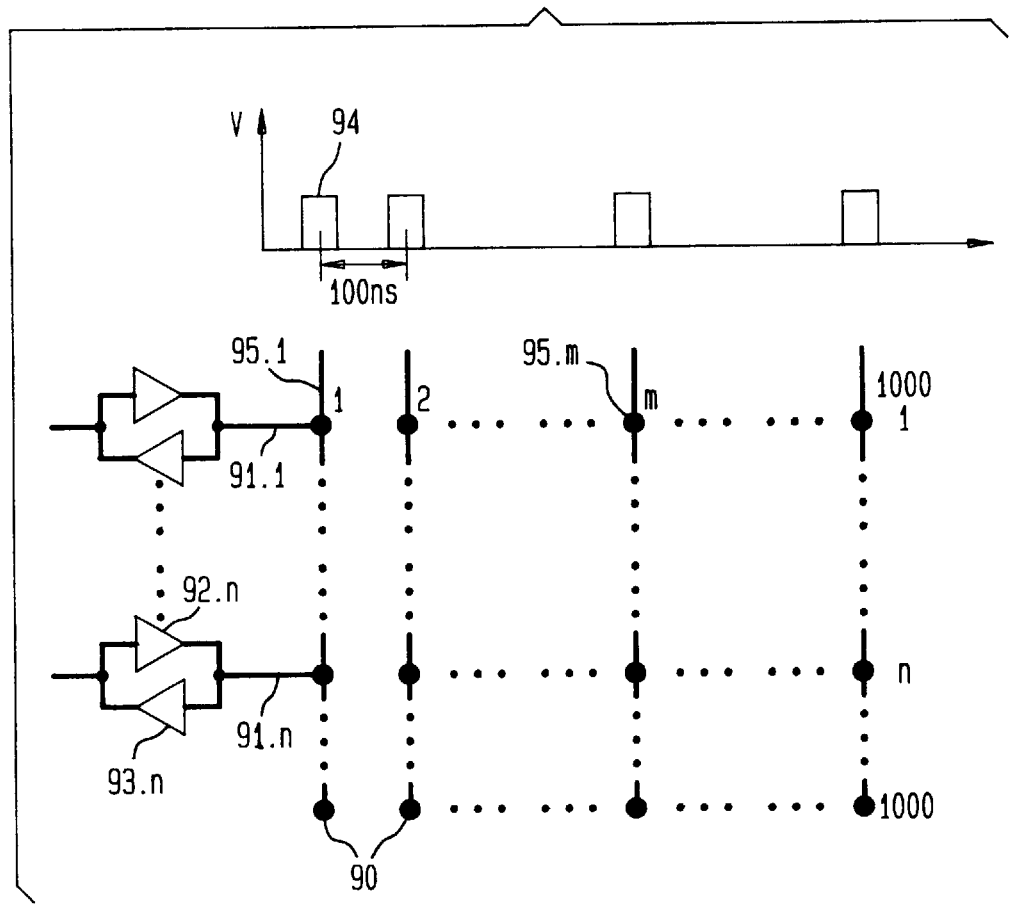
FIG. 9 shows a schematic diagram of the tip of the local probe array, in accordance with the present invention.

Another embodiment of the present invention is now described. To obtain a storage which is suitable as replacement of conventional storage means, the storage capacity needs to be sufficiently high. Such a high storage capacity can be realized in that a storage medium 70 with many storage fields 71 is used. In the embodiment schematically illustrated in FIG. 7, the storage medium 70 carries 1000× 1000 storage fields 71, each storage field having a capacity of $10^6$ bits. This leads to a storage device which is capable of storing up to 1 Terabit. To access this information, a two-dimensional local probe array 72 having 1000×1000 cantilevers 73 and probes is provided. This two-dimensional array 72 of cantilevers is placed at a close distance to said storage medium 70 and a probe is assigned to each storage field thereof. In the present example the storage device makes use of the tunneling effect for reading and writing of information. In order to individually address each one of the probes, an appropriate wiring is needed. If the storage medium 70 is kept on ground potential by using a common contact to its backside, there is one access line per probe required. This assumption only holds if the cantilevers do not require active positioning means, such as fine actuators for z-displacement. The real estate on the substrate of the 2-dimensional local probe array 72 would not be sufficient to carry the $1000^2$ access lines. According to the present invention this problem is circumnavigated in that said storage device comprises another layer 74, referred to a level 3, which is flipped onto the substrate with cantilever arrays 72. This level 3 carries the read/write lines 75.x, and select lines 76.x and, if space permits, additional electronic read/write circuitry, for example. The employment of read/write lines 75.x and select lines 76.x requires a multiplexed addressing scheme which will be described in detail in connection with FIG. 9. The three levels of the present storage device are only illustrated schematically in FIG. 7.

If the electrical wiring cannot be realized on one side of the level 3 board 74, printed circuit boards with several layers of metallization and isolation sheets can be used. By means of appropriate vias the access lines penetrate through the board and end in a metallization pad. These pads are carried out and arranged such that an electrical contact to the probes of the local probe array 72 is ensured if the level 3 board 74 is flipped onto it. Solder bonding, which is normally used to connect several printed boards, is well suited to be used in connection with the present invention. The alignment accuracy which can be achieved is sufficient to realize high density storage devices in accordance with the present invention. In addition to using the solder bonds for alignment and mechanical interconnection, these bonds can serve as electrical connections between the local probe array and the board 74. One might also envision capacitive electrical coupling from level 3 to level 2.

Figure 7:
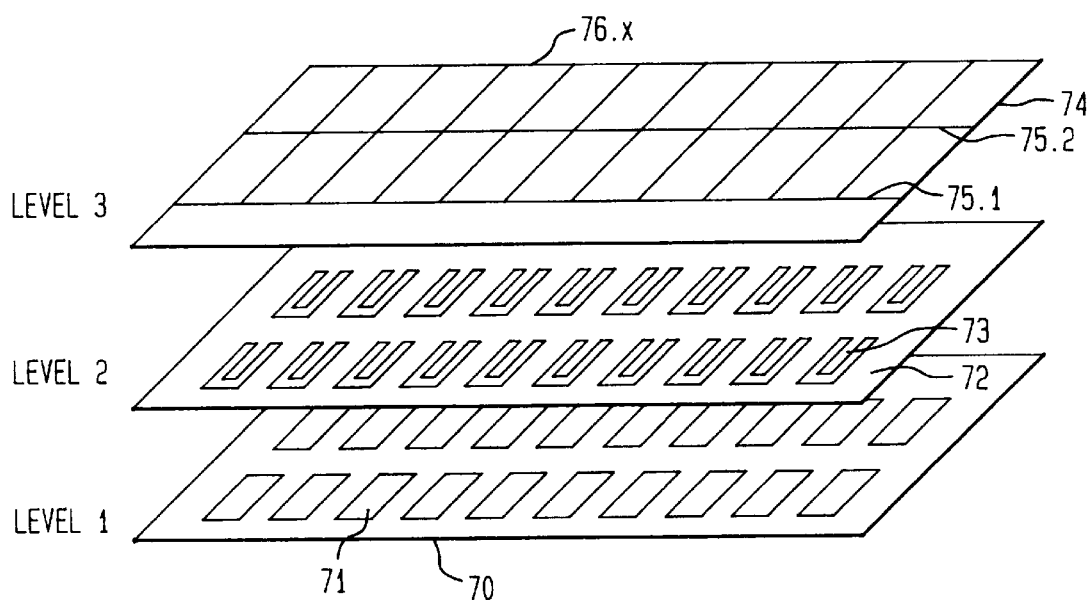
FIG. 7 shows a perspective view of another storage device comprising of at least 3 levels, in accordance with the present invention.

The embodiment illustrated in FIG. 7 comprises the following materials and the read/write process is based on the below described approach. The storage medium 70 comprises a ferroelectric material, e.g. PZT, which is locally polarized by means of a probe of the local probe array 72. Well suited are thin film ferroelectric materials. The storage medium retains a local remnant polarization after the tip is moved forward to a next bit position. A reverse polarization voltage applied would polarize the medium in the opposite direction. This effect could be used for bistable storage devices having a higher storage density. The local polarizations are non-volatile, i.e. remain unchanged if the local probe is moved away. The perturbations in form of a local polarizations can be detected, i.e. read, by measuring the interaction of a field applied by a local probe and the polarization state. This interaction leads to changes in the tunneling voltage or current. A preferred embodiment would be to scan the tips over the storage fields without contacting it. By applying the required reading and writing voltages between the tip and the corresponding storage field information can be stored and retrieved. In order to erase information, the tips of the local probe array 72 are operated in the field emission mode instead of the tunneling current mode used for reading and writing. In the field emission mode larger voltages or currents can be introduced to the storage fields. This approach is not well suited for bit-by-bit erasure of information because it has a reduced resolution and is slower. According to the present invention, the field emission mode is used for cleaning-up whole fields. This process of cleaning-up is controlled and carried out by special data management means, already mentioned in connection with the first embodiment.

Figure 8:
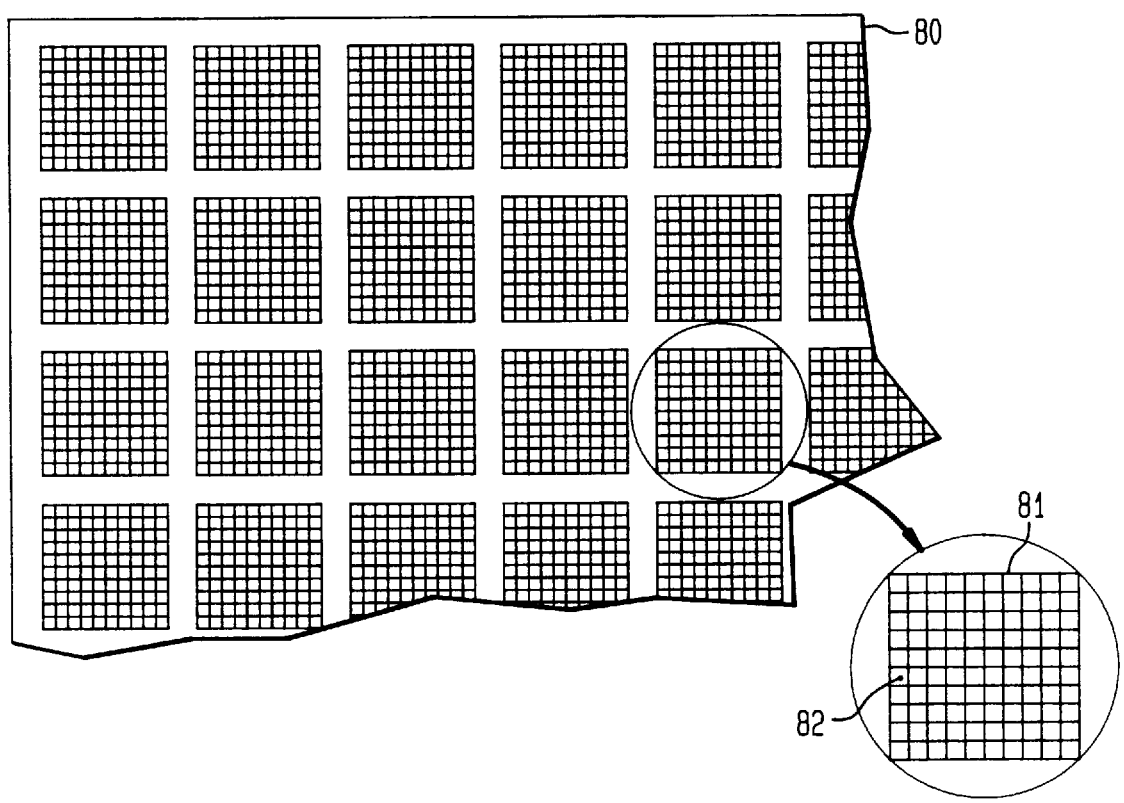
FIG. 8 is a top view of a part of a storage medium comprising sub-arrays, in accordance with the present invention.

In FIG. 8 part of another storage medium 80 is shown. This storage medium is partitioned into several sub-arrays 81. Each such sub-array has a great number of storage fields 82 (see magnified sketch) as for example described in connection with FIGS. 1, 2, or 7. By means of partitioning the storage medium in such a manner, storage devices with even higher storage capacity can be realized. One local probe array is now assigned to each of the sub-arrays 81. These local probe arrays are mechanically independent so that some sub-arrays can be in a read/write mode while others are are parked or flipped away so that the storage fields underneath can be cleaned-up. Each of the sub-arrays might have its own read/write electronics and multiplexers/ demultiplexers. Higher level data management means are provided to control data flow between sub-array, to redistribute incoming data if some sub-arrays are currently not available or accessible, and so on.

Error detection and correction (EDC) is performed in such a storage device by each sub-array making it capable of detecting single or double bit errors and correcting single bit errors. This is preferably done by appending one byte of error correcting code (ECC) to each 4 bytes of memory.

Figure 10:
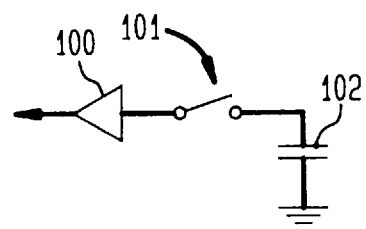
FIG. 10 shows a schematic diagram of a simple transistor switch and a read-out amplifier, in accordance with the present invention.

As already mentioned above, a storage device with N×N storage fields and N×N local probes requires $N^2$ address lines. A storage device with 1000×1000 local probes would require $10^6$ address lines would not fit onto the surface area of the local probe array. Another scheme, which is described by reference to FIG. 9, can be used in such a situation. In this Figure the tips 90 of a 2-dimensional 1000×1000 local probe array are schematically depicted. Read/write lines 91.x with read amplifiers 93.x and write amplifiers 92.x are indicated on the left hand side of the local probe array. Additionally, this storage device comprises 1000 select lines 95.x. According to this scheme, only N read/write lines and N select lines, i.e. 2×N in total, are needed and the read/write process is carried out in a staggered manner, i.e. short pulses are fed through the select lines 95.x. Due to this, one row of tips is addressed after the other. In the present example, it takes 100 ns until an adjacent row of tips is addressed, as indicated in the uppermost portion of FIG. 9. It takes 100 $\mu$s to address all 1000 select lines 95.x. If one uses cap-sensing for reading information stored on a storage medium, the tip capacity 102 could be sampled at a rate of 100 ns using a simple transistor switch 101 and a read-out amplifier 100. The respective block-diagram is given in FIG. 10. A similar approach is already used in current dynamic random access memories (DRAMs) with the only difference that the DRAM capacity is replaced by the capacity of the local probe, i.e. the tip capacity.

In the following a computer system comprising a storage device according to the present invention is outlined. The storage device comprises a plurality of sub-arrays each having its own and mechanically independent local probe array. The sub-arrays are arranged in banks and pages for receiving data bits to be stored and for retaining data bits from said devices. In addition, the storage device comprises a plurality of read/write lines connecting to said local probes for transferring data bits thereto and therefrom. A connector is coupled to said read/write lines in order to couple the storage device to the computer system. The whole storage devices is placed inside a protective enclosure. A memory controller is in addition employed to control access to said storage device and its sub-arrays, to synchronize data exchange, and to perform a memory check at power-on. This memory controller might either comprise the data management means according to the present invention or might interact with such data management means via a serial or parallel interconnection bus. The present storage device might further be connected to a Static Random Access Memory (SRAM) buffer for storing a row of data from said storage device. The above memory controller would in this case also interact with the SRAM to load and select it. Such a SRAM can also be used as temporary memory for clean-up.

The present storage devices are very well suited for use as video storage. For example, 64-bit words can be stored and retrieved very fast. If the storage device is linked to the image processor via a high speed bus systems, e.g. an optical bus, images can be processed and displayed in a fast and consecutive manner.

Storage devices as described above, have an enormous storage capacity. Depending on the computer or system in which such a storage device is used, it might be sufficient, if a clean-up and data compression are carried out once a day, during night or weekend, or if no program currently takes access to the storage. In a device as illustrated in FIG. 7, data management means are either integrated into one of the levels 1–3, or are carried out as separate unit. If this data management means determines that the storage device is almost full, or that there are many fields which comprise obsolete data, a clean-up process is initiated. Depending on the implementation the clean-up process is started only if the data management system realizes that neither the keyboard nor any application program is active. In a portable computer the clean-up process might be started if the computer is in a stand-by mode.

As already described, the storage medium might also be heated, illuminated, de-magnetized or the like to erase information. To do so, either the cantilever array has to be flipped away, or parked at a safe distance such that the storage medium can be accessed from above. It is also possible to access the storage medium from underneath to erase information. A resistive layer could for example be attached to the storage medium's backside. By applying a voltage to this resistive layer, the temperature of the medium could be increased. Depending on the storage medium used, such a temperature treatment leads to a removal of perturbations.

There are some storage media known in the art where perturbations can be removed bit-by-bit. It was reported that such perturbations can not be removed totally. This leads to an increasing signal-to-noise ratio the longer a storage medium is used. A storage-field or even global erase process can then be employed from time to time to remove residuals on the medium which might falsely be interpreted as information. Such a storage-field or global erase process usually requires quite some energy. If the present storage devices are used in portable computers, it is recommended to wait until the computer is connected to an AC power supply. An erase process can then be carried out without wasting energy from the battery.

Since the local probe array is the most expensive part of a storage device according to the present invention, an increased storage capacity can be achieved as follows, without unnecessarily increasing the cost of such a device. Each local probe of a local probe array might be assigned to several storage sections. Assuming that there are ten storage sections assigned to each local probe of a local probe array having ten such local probes, the first ten storage sections could be accessed by these ten probes in parallel. If one of these ten sections is filled up, the whole local probe array is moved so as to access the next ten storage sections, and so on. The read access to information stored in storage sections which are currently not acted upon by said local probe arrays is slowed down, because the whole local probe array needs to be moved over a 'larger' distance before the respective storage sections can be reached by the local probes.

The present invention is well suited for use in a multi-processor environment. In such an environment the present storage device could be partitioned into multiple autonomous sub-arrays. Each such sub-array might then be assigned to a particular processor of the multiprocessor systems. Other subarrays of the storage device might be shared such that results of certain computations are made available to all processors. In these shared subarrays the application program can be stored also.

By means of the parallel operation of miniaturized local probes arrays, according to the present invention, storage densities in the range of Terabits and data rates of 100 Gigabit/sec can be achieved.

We claim:

1. Storage device comprising:
   a storage medium on which information can be stored in form of perturbations,
   a local probe array facing said medium such that its probe scan said medium,
   means for obtaining signals from each of said probes when scanning over said perturbations, and
   means for writing perturbations onto said medium,
   said device being characterized in that it further comprises
      means for distinguishing between information to be erased from a first section of said medium and information in this section which is not to be erased,
      means for selectively copying said information which is not to be erased into a memory, preferably another section of said medium, and means for erasing the whole first section.

2. The storage device of claim 1, wherein said means for erasing are carried by said local probe array, and are arranged such that they are capable of erasing whole sections of said storage of said storage medium at once.

3. The storage device of claim 1, wherein said means for erasing are situated at one side of said medium whereas said local probe array is situated on the other side thereof, and are arranged such that they are capable of erasing whole sections of said storage medium at once.

4. The storage device of claim 1, wherein said local probe array comprises a 1- or 2-dimensional array of cantilevers each of which carries one or several local probes which are either kept at a certain distance from said medium, or are operated in contact mode.

5. The storage device of claim 1, wherein said local probe array or said medium is moved in a closed loop manner such that each probe scans a certain section of said storage medium.

6. The storage device of claim 1, wherein said medium is partitioned into multiple storage fields each of which being scanned by at least one corresponding local probe.

7. The storage device of claim 1, comprising data management means which distinguish between information to be erased from a first section of said medium and information in this section which is not to be erased by analyzing pointers or flags which identify said information to be erased.

8. The storage device of claim 7, wherein said data management means compares the amount of information to be erased from a first storage field with the amount of another storage field to determine, based on predefined rules, which storage field is to be erased first.

9. The storage device of claim 7, wherein said data management means employs a genetic algorithm.

10. The storage device of claim 7, wherein either each storage field comprise said flags which point at bits of said storage field which are to be erased, or said storage medium comprises said table in which erase pointers are maintained which point at bits of storage fields which are to be erased.

11. The storage device of claim 4, wherein said cantilevers carry several probes such that whole bit-words can be written onto said medium or read from said medium.

12. The storage device of claim 1, comprising actuators which cause a a lateral scan movement of said medium with respect to said local probe array, or of said local probe array with respect to said medium.

13. The storage device of claim 1, comprising actuators which partially remove or flip away said local probe array from a section of said medium which is to be erased.

14. The storage device of claim 1, comprising a board carrying address lines for read/write access to said probes, said board being flipped onto said local probe array such athat each of said address lines is electrically coupled to the corresponding probe.

15. The storage device of claim 14, wherein said board comprise read/write circuitry.

16. The storage device of claim 1, wherein said medum is divided into multiple autonomous sub-arrays, each of which has multiple storage fields and a local probe array which is independent of the local probe arrays of adjacent sub-arrays.

17. The storage device of any of the preceding claims, wherein said medium comprises a semiconducting substrate covered by a thin oxide layer which is coated by a dielectric layer and wherein perturbations are created by locally applying a bias by mean of a probe such that charges are trapped in said medium.

18. The storage device of claim 17, wherein said probes are conducting tips and wherein said medium comprises a back contact to said semiconducting substrate such that charges are locally introduced into the medium if a voltage is applied between a tip and said back contact.

19. The storage device of claim 1, wherein said medium comprises ferroelectric material in which perturbations are generated by locally polarizing it by means of a voltage applied to said probes.

20. The storage device of claim 19, wherein said perturbations are detected by interaction of a field applied to a probe and the polarization of said perturbation.

21. The storage device of claim 19, wherein said perturbations of a section of said medium or of a whole storage field are erased by applying a sufficiently large voltage or current to said probes or other means for erasing information in order to operated them in the field emission mode.

22. The storage device of claim 1, wherein said medium comprises a material in which perturbations can be formed by locally heating said material.

23. The storage device of claim 22, wherein said perturbations of a whole section can be removed by heating up the whole section.

24. The storage device of claim 1, wherein said storage medium comprise an organic material, preferably a polymer or wax, or liquid crystal.

25. The storage device of claim 1, comprises m local probes and n storage sections being assigned to each of said m local probes, i.e., the storage device comprises m times n storage sections.

26. A mass storage comprising several storage devices according to claim 1 and means for interconnecting said mass storage to a computing system.

27. Method for erasing information stored in a storage device comprising a storage medium in which said information is stored in form of perturbations, a local probe array facing said medium such that its probes scan said medium, means for obtaining signals from each of said probes when scanning over said perturbations, and means for writing perturbations onto said medium, characterized by the following steps:

distinguishing between information to be erased from a first section of said medium and information in this section which is not to be eased, selectively copying said information which is not to be erased into a memory, preferably another section of said medium, and erasing the whole first section.

28. The method of claim 27, wherein information to be erased from a first section of said medium and information in this section which is not to be erased is distinguished by analyzing pointers or flags identifying said information to be erased.

29. The method of claim 27, wherein the amount of information to be erased from a first storage field is compared with the amount of other storage fields in order to decide which storage field is to be erased first.

30. The method of claim 27, wherein information read from a storage file which is to be erased is compressed before it is written into said memory.

* * * * *